United States Patent [19]
Chow

[11] Patent Number: 6,002,599
[45] Date of Patent: Dec. 14, 1999

[54] VOLTAGE REGULATION CIRCUIT WITH ADAPTIVE SWING CLOCK SCHEME

[75] Inventor: Hwang-Cherng Chow, Hsinchu, Taiwan

[73] Assignee: Industrial Technology Research Institute, Hsinchu, Taiwan

[21] Appl. No.: 09/064,283

[22] Filed: Apr. 22, 1998

[51] Int. Cl.⁶ .............................. H02M 3/18; G05F 1/40
[52] U.S. Cl. .............................................. 363/59; 323/284
[58] Field of Search .................................. 363/59, 60, 62; 327/536, 537, 538, 540, 530; 365/185.03; 323/282, 284, 280

[56] References Cited

U.S. PATENT DOCUMENTS 5,694,072  12/1997  Hsiao et al. ............................. 327/537
5,703,807  12/1997  Smayling et al. ................... 365/185.03
5,768,115   6/1998  Pascucci et al. .......................... 363/59

Primary Examiner—Y. J. Han
Attorney, Agent, or Firm—Proskauer Rose LLP

[57] ABSTRACT

A CMOS voltage regulator uses clock signals from an adaptive swing clock generator to control the output voltage of a charge pumping circuit. A divided portion of the output voltage is fed to a differential amplifier, where it is compared to a pre-set reference voltage. A negative feedback signal is generated from the differential amplifier and inputted to the adaptive swing clock generator, where it causes the clock signals to change amplitude in an inverse relationship to changes in the output voltage. When the divided portion of the output voltage equals the pre-set reference voltage, a steady-state output voltage condition is achieved.

17 Claims, 11 Drawing Sheets

VOLTAGE REGULATION CIRCUIT WITH ADAPTIVE SWING CLOCK SCHEME

FIELD OF THE INVENTION

The present invention relates generally to CMOS integrated circuits. More specifically, the present invention relates to a constant voltage generating circuit having an adaptive swing clock scheme.

BACKGROUND OF THE INVENTION

It is often desirable to generate internal voltages which are higher than the available power supply voltage for certain integrated circuit applications. For example, an operating voltage of 10V to 12V is usually required for programming a nonvolatile memory cell, such as an EPROM or a Flash memory. To meet this demand, charge pumping circuits are typically used to generate such on-chip high voltages. The conventional voltage multiplier circuit proposed by J. F. Dickson in IEEE Journal of Solid-State Circuits, vol. SC-11, pages 374–378, June 1976, is shown in FIG. 1. The original circuit consists of many diodes and capacitors. Capacitors C and Cs are the pumping capacitors and the stray (parasitic) capacitors, respectively. The circuit is also driven by two nonoverlapping clocks, ø1 and ø2. The clock amplitude $V_\phi$ is usually the same as the power supply voltage VDD. The output voltage of the circuit, Vout, can be expressed as $$V_{out} = VDD - Vd + n \times \left[ V_\phi \times \frac{C}{C + C_s} - Vd - \frac{I_{out}}{f(C + C_s)} \right]$$

where Vd is the forward voltage drop of a diode, n is the number of pumping stages, Iout is the output current loading and f is the frequency of the driving clock.

From the above equation, it is clear that the magnitude of the output voltage Vout has a proportional relationship to the number of pumping stages and to the clock amplitude $V_\phi$. Although this conventional charge pumping circuit may be used for on-chip high voltage generation, its stability is sensitive to process variations and operating conditions, such as temperature and voltage.

To enhance the reliability of nonvolatile memory, a constant voltage generating circuit is often desired. For this purpose, modifications to the Dickson voltage multiplier circuit have been developed in the prior art.

One example is disclosed in Japanese Patent Application Laid-open Publication JP-A-4-372571, as shown in FIG. 2. This constant voltage generating circuit comprises a step-up circuit 50 (charge pumping circuit), a clamp circuit 60a, a voltage detecting circuit 70a, and a clock control circuit 80a. (For detailed circuit descriptions, please refer to U.S. Pat. No. 5,499,183, Column 1, line 12, to Column 2, line 46, in regard to FIG. 1A). In summary, the output voltage VPP is initially 'logic low'. As its voltage level is stepped up, the voltage level VB is elevated to 'logic high'. The output of inverter I71 changes its state to 'logic low', so that the external clock is disabled by NAND gate N81. Since the external clock is not transmitted to the clock input terminal, the step-up circuit 50 stops its operation. Once the step-up circuit 50 stops its operation, the output voltage VPP is maintained at a constant voltage level, with reduced power dissipation. However, the clamp circuit 60a is basically a resistive voltage divider, so this circuit has a certain level of dc power consumption. In addition, the voltage detecting circuit, inverter I71, has a logic threshold voltage which is inherently sensitive to process variation and operating voltage. Therefore, it is difficult to obtain a precise, stable VPP voltage.

Another example is disclosed in U.S. Pat. No. 5,602,794, issued to J. J. Javanifard et al. This invention relates to a charge pump with a variable number of stages, as opposed to a fixed number of stages. As shown in FIG. 3, the two charge pumping circuits 110 and 120 are connected in parallel for the lower voltage generation, while for the higher voltage generation, the two charge pumping circuits are connected in series, via control switches 130 and 131. Therefore, the output voltage level can be controlled by changing the interconnecting configuration of charge pumping circuits.

A similar prior art technique is disclosed in U.S. Pat. No. 5,574,634, issued to D. B. Parlour et al. As shown in FIG. 4, a voltage tripler circuit has a comparator U51 to detect the output voltage from the capacitive voltage divider (capacitors C51 and C52). Initially, the voltage level at node N53 is 'logic low', such that the output of comparator U51 is 'logic high', and the output Q of latch L51 is also 'logic high'. Therefore, all pumping capacitors C54 and C55 are activated by nonoverlapping clock signals ø1 and ø2. When VPP is high enough, the output of the comparator U51 changes its state to 'logic low'. As a result, the output Q of latch L51 is also 'logic low', which disables the pumping operation of capacitor C54. Once the pumping capacitor C54 stops its operation, the output VPP is maintained at its voltage level by the pumping capacitor C55. With regard to minimizing dc power consumption, the capacitive voltage divider of Parlour et al. is preferable to the prior art resistive voltage divider of FIG. 2. However, the circuit shown in FIG. 4 still focuses on controlling the output voltage by varying the number of pumping stages, which makes it difficult to achieve a precise, stable output voltage level.

Accordingly, it is an object of the present invention to overcome the disadvantages of the prior art. It is a further object of the present invention to minimize dc power consumption in the inventive circuit.

SUMMARY OF THE INVENTION

In accordance with an illustrative embodiment of the present invention, a CMOS integrated circuit is provided for regulating a voltage output signal. A clock generator circuit, connected between high and low power supply busses, develops nonoverlapping clock signals which are used to drive a conventional charge pumping circuit. The amplitude of the nonoverlapping clock signals is derived from the voltage difference between the high and low power supply busses, as modified (regulated) by a pass transistor in series with either the high power supply bus (for NMOS) or the low power supply bus (for PMOS).

The output voltage of the charge pumping circuit is connected to a voltage divider, and a divided portion of this output voltage is inputted to one side of a comparator. A pre-set reference voltage is inputted to the other side of the comparator. The comparator outputs a difference voltage which is fed back to the pass transistor in order to control the voltage drop across the pass transistor, which has the effect of controlling the voltage difference across the nonoverlapping clock circuit. The comparator polarity is configured so that its difference output voltage acts as a negative feedback signal to the clock generator circuit. As a result, the amplitude of the nonoverlapping clock signals is made to vary in an inverse relationship with changes in the charge pumping circuit output voltage. Since the charge pumping circuit output voltage level is proportional to the amplitude of the nonoverlapping clock signals, the output voltage level reaches a steady-state condition when its divided portion into the comparator is equal to the reference voltage into the comparator. Thus, a precisely controlled, constant output voltage is obtained at the output of the charge pumping circuit. Moreover, if a capacitive voltage divider is used, the inventive circuit requires very little DC power.

An illustrative embodiment of the present invention is more fully described below in conjunction with the following drawings.

DETAILED DESCRIPTION OF THE INVENTION

Figure 1:
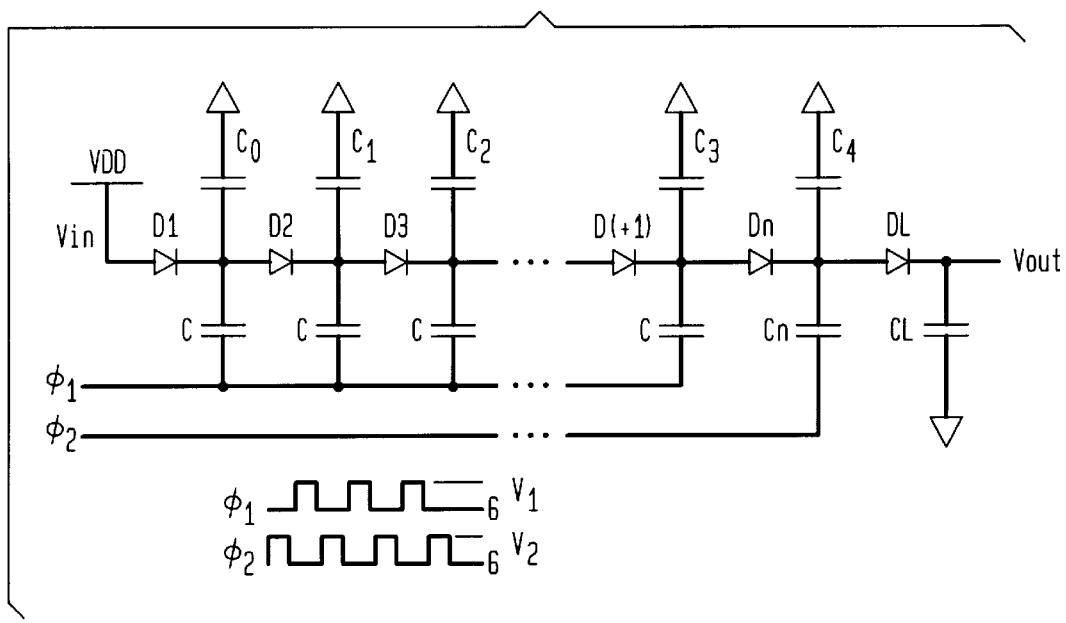
FIG. 1 is a prior art schematic of the Dickson diode voltage multiplier (charge pumping circuit).
Figure 2:
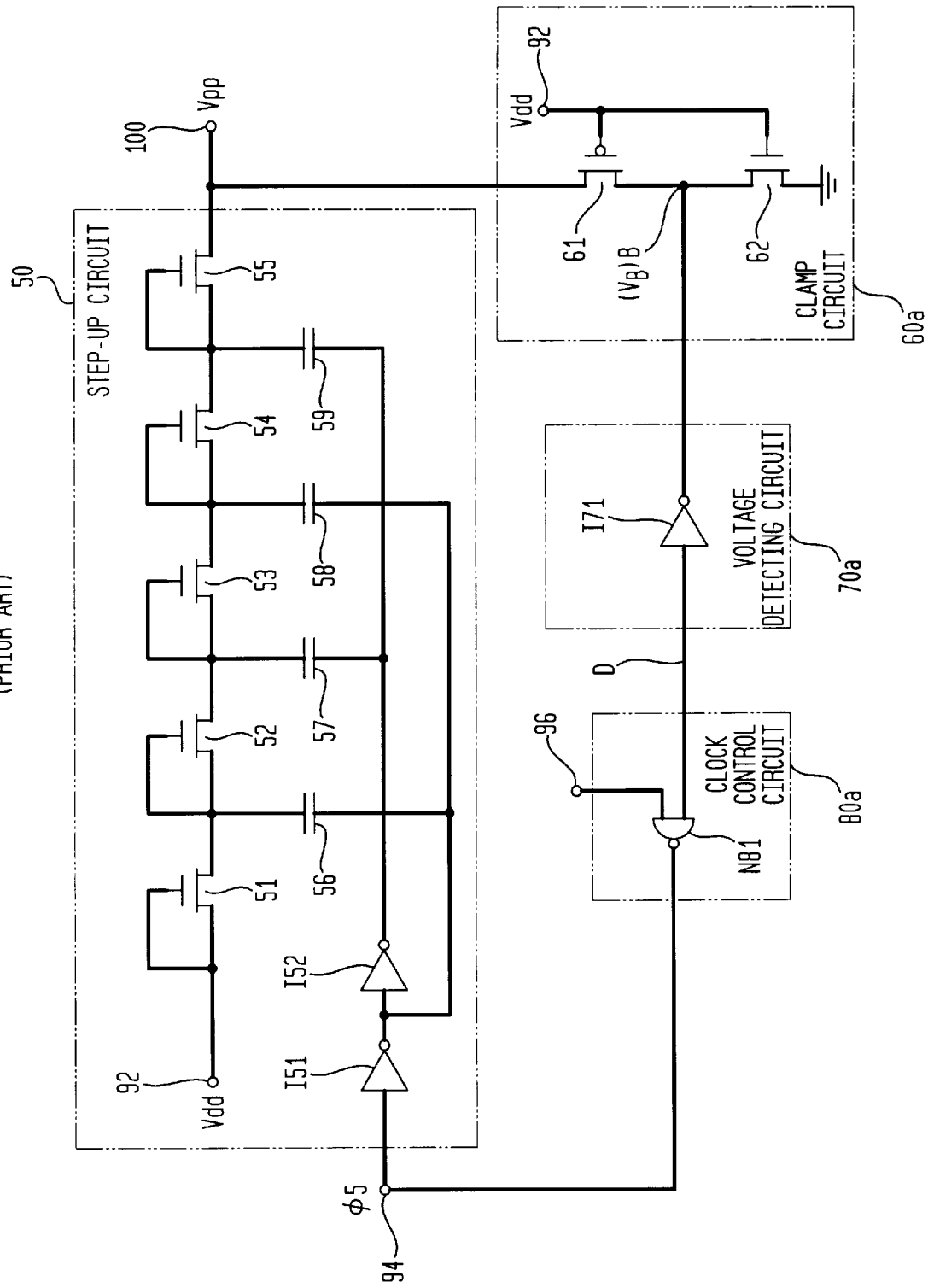
FIG. 2 is a prior art schematic of a constant voltage generating circuit (Japanese Patent JP-A-4-372571).
Figure 3:
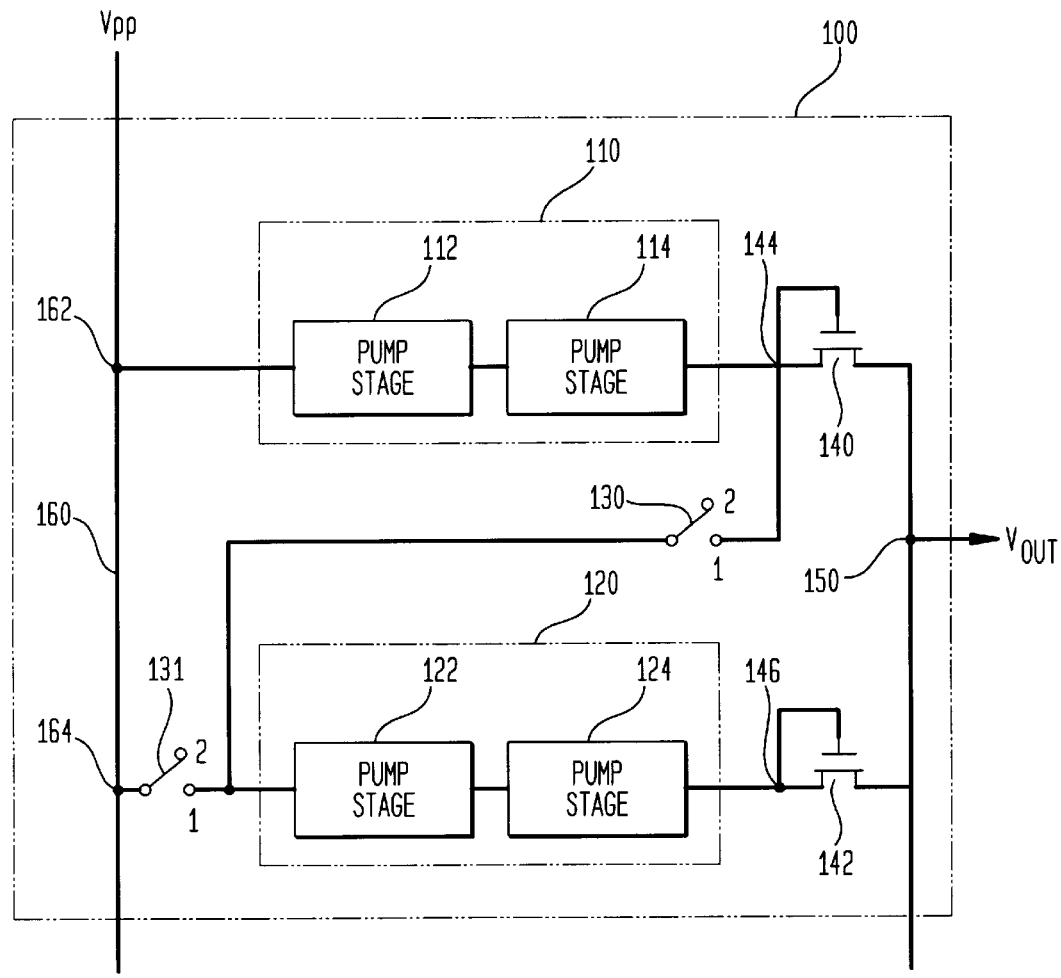
FIG. 3 is a prior art schematic of a variable stage charge pump (U.S. Pat. No. 5,602,794).
Figure 4:
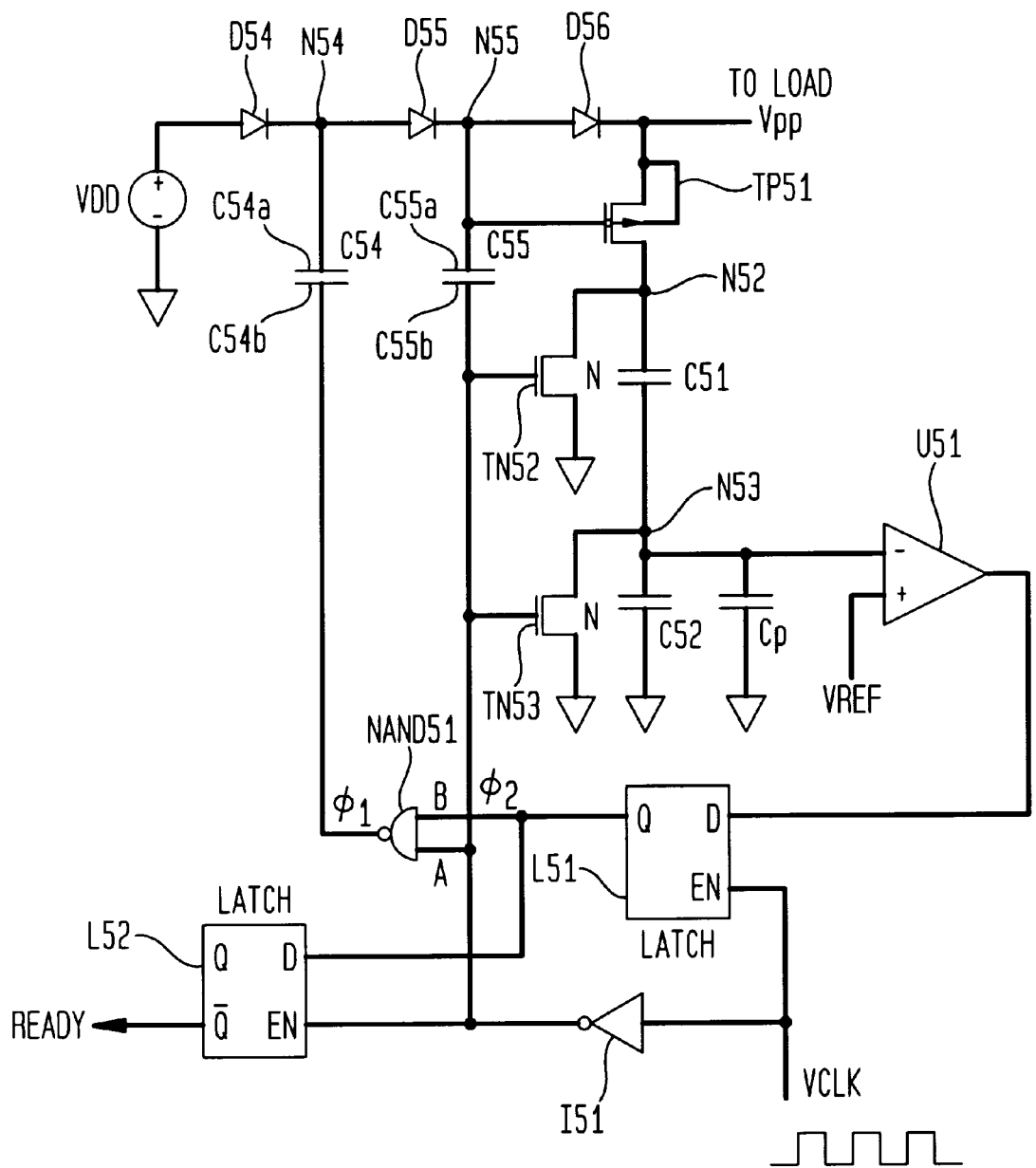
FIG. 4 is a prior art schematic of a regulated voltage pump (U.S. Pat. No. 5,574,634).
Figure 5:
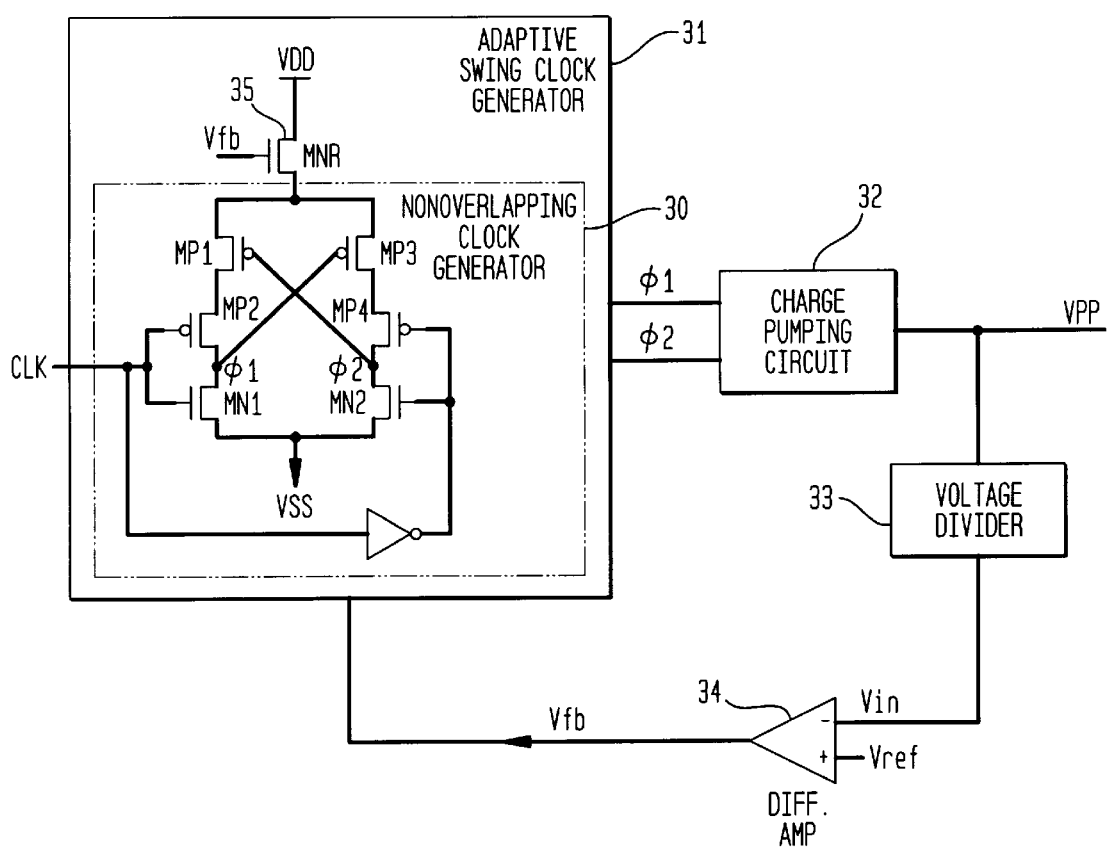
FIG. 5 is a first preferred embodiment of a voltage regulation circuit with adaptive swing clock scheme in accordance with the present invention.

In accordance with this invention, a first embodiment of a voltage regulation circuit with adaptive swing clock scheme is shown in FIG. 5. The circuit consists of an adaptive swing clock generator 31, a charge pumping circuit 32, a voltage divider 33, and a differential amplifier 34. The circuit structure can be summarized as follows:

(1) Adaptive swing clock generator 31:

This block includes a regulation NMOS MNR 35 and a conventional 2-phase nonoverlapping clock generator 30. The 2-phase nonoverlapping clock generator 30, comprising MP1, MP2, MP3, MP4, MN1 and MN2, receives an input clock signal CLK and generates therefrom ø1 and ø2 nonoverlapping clock signals. The voltage amplitude swings of clock signals ø1 and ø2 are controlled by a feedback voltage Vfb, which is derived from the output of differential amplifier 34 and inputted to regulation NMOS MNR 35. Importantly, regulation NMOS MNR 35 functions as a pass transistor, as described more fully in the circuit operation section below, such that the "real" operating voltage of clock generator 30 is no longer a constant value VDD.

(2) Charge pumping circuit 32:

A conventional charge pumping circuit can be used, composed of diodes (or diode-connected MOS devices) and pumping capacitors.

(3) Voltage divider 33:

A capacitive voltage divider is used in preference to a resistive voltage divider, since no dc power is dissipated. However, a resistive voltage divider can also be used.

(4) Differential amplifier 34:

Differential amplifier 34 is characterized as a high gain amplifier, and receives Vin (the output voltage from voltage divider 33) and Vref (a pre-set reference voltage) as its two input signals. Differential amplifier 34 then generates Vfb as an output feedback control signal, which is inputted to adaptive swing clock generator 31.

The circuit operation of the inventive embodiment shown in FIG. 5 will now be described in more detail. Initially, the output voltage VPP is 0V, so that Vin is also 0V. Therefore, differential amplifier 34 outputs a signal Vfb which is a high voltage, approaching the level of the power supply VDD. Since regulation NMOS MNR 35 functions as a pass transistor, the voltage amplitude swings of clock signals ø1 and ø2 range from (Vfb—the threshold voltage of MNR 35) to VSS (0V). Since MNR 35 is an NMOS device, its threshold voltage is positive, e.g., 0.8V. However, for the initial condition, Vfb is assumed equal to VDD. Therefore, the voltage swings range from (VDD—threshold voltage of MNR 35) to VSS. As a result, charge pumping circuit 32 is activated to elevate the VPP output voltage level. As VPP increases, Vin increases proportionately, in accordance with the division ratio of voltage divider 33. If Vin becomes larger than Vref, output Vfb decreases towards the ground level VSS. This causes the voltage drop across pass transistor MNR 35 to increase, thus effectively lowering the operating voltage of clock generator 30. As the voltage swings of clock signals ø1 and ø2 are decreased, the output signal VPP is decreased accordingly. As such, output VPP is kept at a constant voltage level, where Vin is equal to Vref. Based on the voltage division ratio of voltage divider 33, a precise voltage level of VPP can be obtained, with high stability.

Thus, a closed loop circuit with negative feedback is disclosed, which ultimately settles into a steady-state condition. As a result, there is no direct path for dc leakage current between VDD and VSS. For example, if CLK=5V., MP2 is off and MN1 is on, while MP4 is on and MN2 is off. Thus, ø1 is discharged to 0V., which turns on MP3. Then, ø2 is charged to 5V., which turns off MP1. Under these conditions, it is clear that there is no direct dc leakage path between VDD and VSS. Alternately, if CLK=0V., MP2 is on and MN1 is off, while MP4 is off and MN2 is on. Thus, ø2 is discharged to 0V., which turns on MP1. Then, ø1 is charged to 5V., which turns off MP3. Again, it is clear that there is no direct dc leakage path between VDD and VSS. Therefore, there is no DC power dissipated in either the adaptive swing clock generator or the capacitive voltage divider.

A further consideration regarding regulation NMOS MNR 35 is that, being simply a pass transistor, an "intrinsic" NMOS is preferable, due to its smaller threshold voltage (about 0.3V). Note that an "intrinsic" NMOS is fabricated without threshold adjustment by means of channel ion implantation. Moreover, it is often the case that an intrinsic NMOS is already provided in a nonvolatile memory process.

Figure 6:
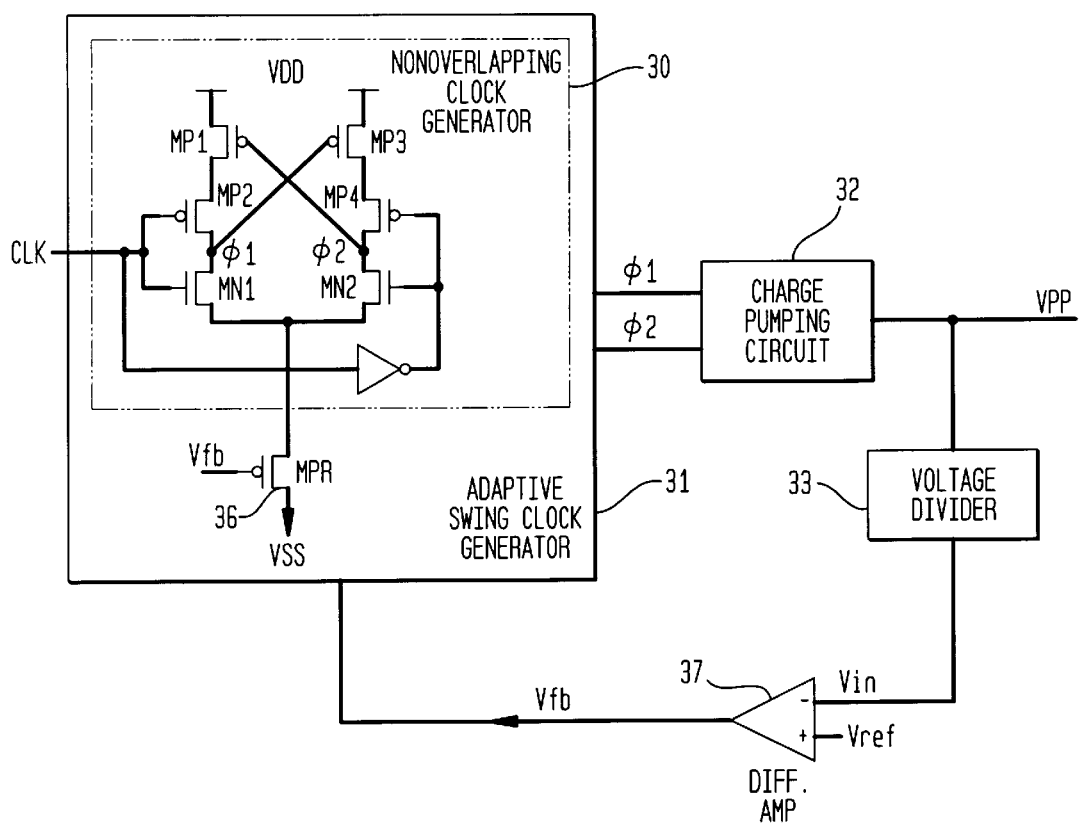
FIG. 6 is a second preferred embodiment in accordance with the present invention.

FIG. 6 shows a second embodiment of a voltage regulation circuit with adaptive swing clock scheme, in accordance with the present invention. For simplicity, the item designation numbers in FIG. 5 are carried over, except where there are differences in the designated items. In FIG. 6, a regulation PMOS MPR 36 is used as the pass transistor in series with the VSS line, instead of the NMOS MNR 35

(FIG. 5) used in series with the VDD line. In the circuit of FIG. 6, the amplitude swings of clock signals ø1 and ø2 range from VDD to (Vfb—the threshold voltage of MPR 36). Since MPR 36 is a PMOS device, its threshold voltage is negative, e.g., −0.8V. However, for the initial condition, Vfb is assumed equal to VSS. Therefore, the voltage swings range from VDD to (VSS—threshold voltage of MPR 36). In addition, the two inputs to the differential amplifier 37 are reversed in polarity to ensure proper negative feedback operation. The circuit operation is very similar to that of FIG. 5. In FIG. 6, the initial output voltage VPP is 0V, so that Vin is also 0V. Therefore, differential amplifier 37 outputs a signal Vfb which is a low voltage, approaching the ground level VSS. Since regulation PMOS MPR 36 functions as a pass transistor, the amplitude levels of clock signals ø1 and ø2 are determined by VDD to the absolute value of the threshold voltage of MPR 36. As a result, charge pumping circuit 32 is activated to elevate the VPP output voltage level. As VPP increases, Vin increases proportionately, in accordance with the division ratio of voltage divider 33. If Vin becomes larger than Vref, output Vfb increases towards the power supply VDD. This causes the voltage drop across pass transistor MPR 36 to increase, thus effectively lowering the operating voltage of clock generator 30. As the voltage swings of clock signals ø1 and ø2 are decreased, the output signal VPP is decreased accordingly. Thus, a closed loop circuit with negative feedback is disclosed, which ultimately settles into a steady-state condition with no dc power dissipation. As such, output VPP is kept at a constant voltage level, where Vin is equal to Vref. Based on the voltage division ratio of voltage divider 33, a precise voltage level of VPP can be obtained, with high stability.

Figure 7:
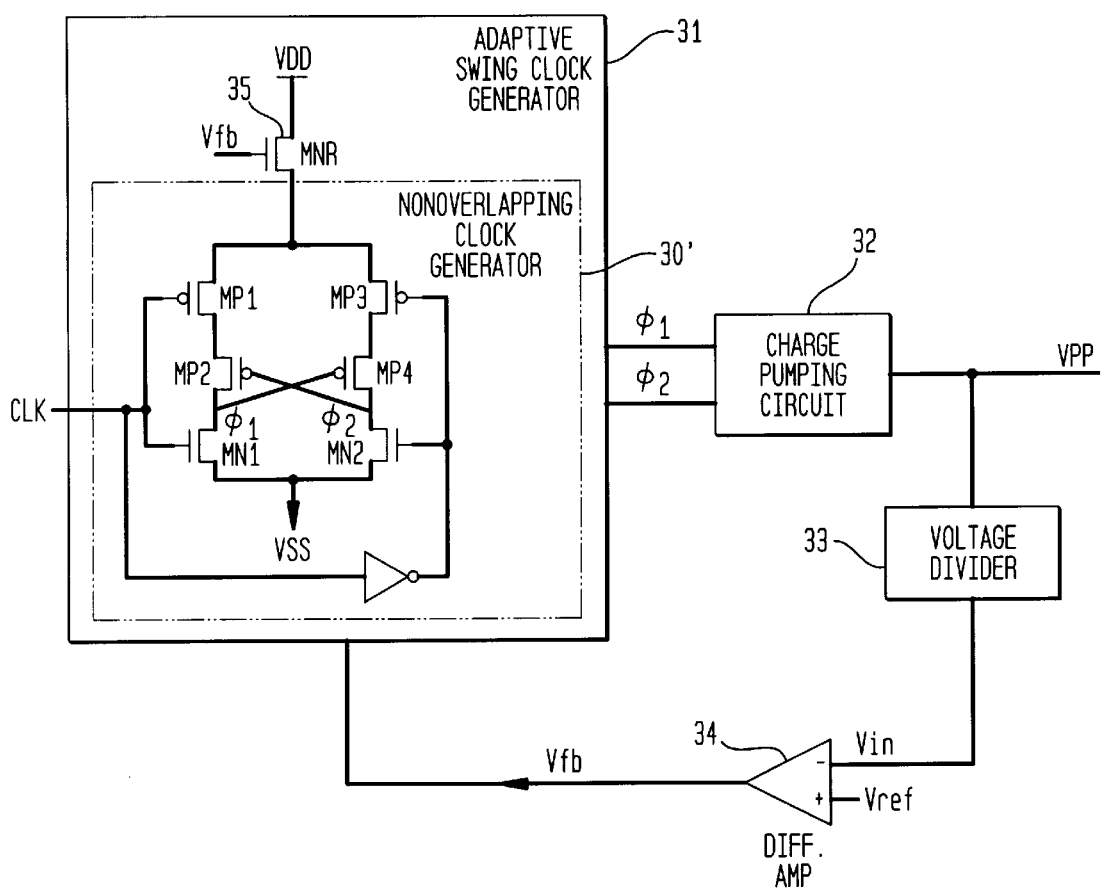
FIG. 7 is a third preferred embodiment in accordance with the present invention.

FIG. 7 shows an alternate embodiment of a voltage regulation circuit with adaptive swing clock scheme according to this invention. This circuit functions in the same manner as the circuit of FIG. 5, except for the different internal configuration of the nonoverlapping clock generator 30'.

Figure 8:
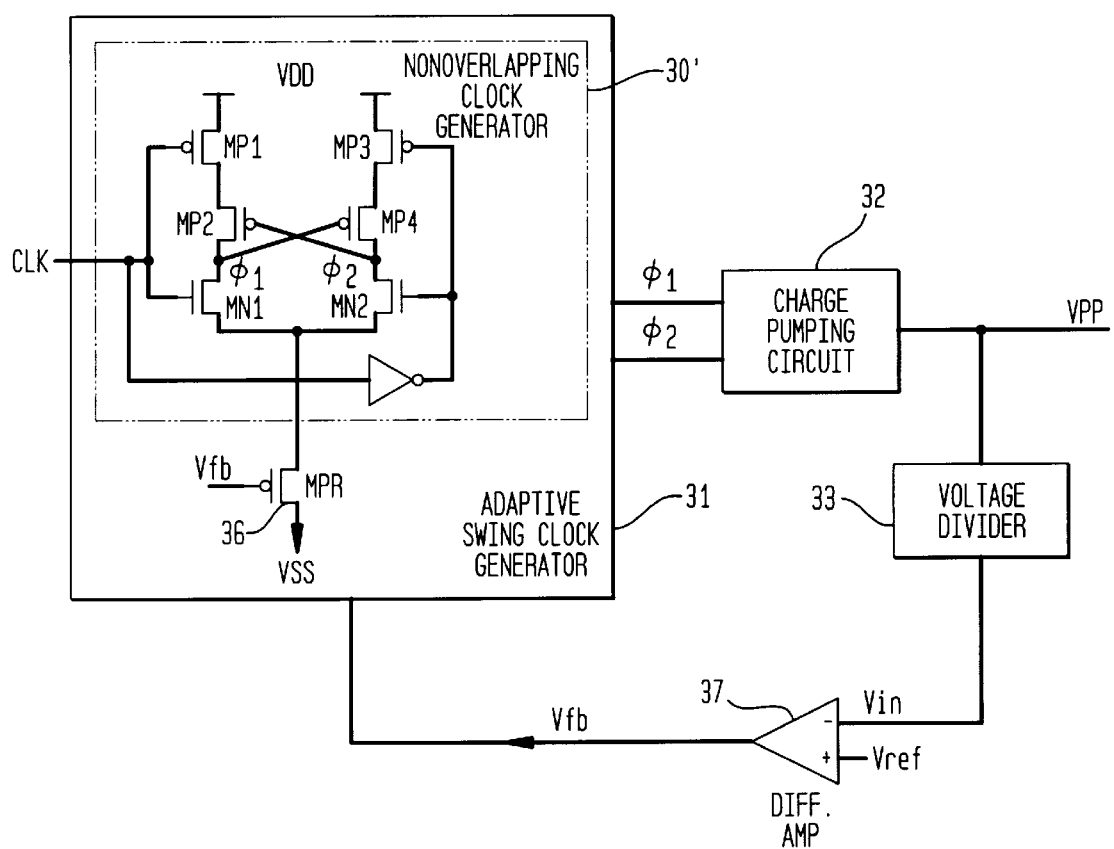
FIG. 8 is a fourth preferred embodiment in accordance with the present invention.

FIG. 8 shows still another embodiment of a voltage regulation circuit with adaptive swing clock scheme according to this invention. This circuit functions in the same manner as the circuit of FIG. 6, except for the different internal configuration of the nonoverlapping clock generator 30'.

Figure 9:
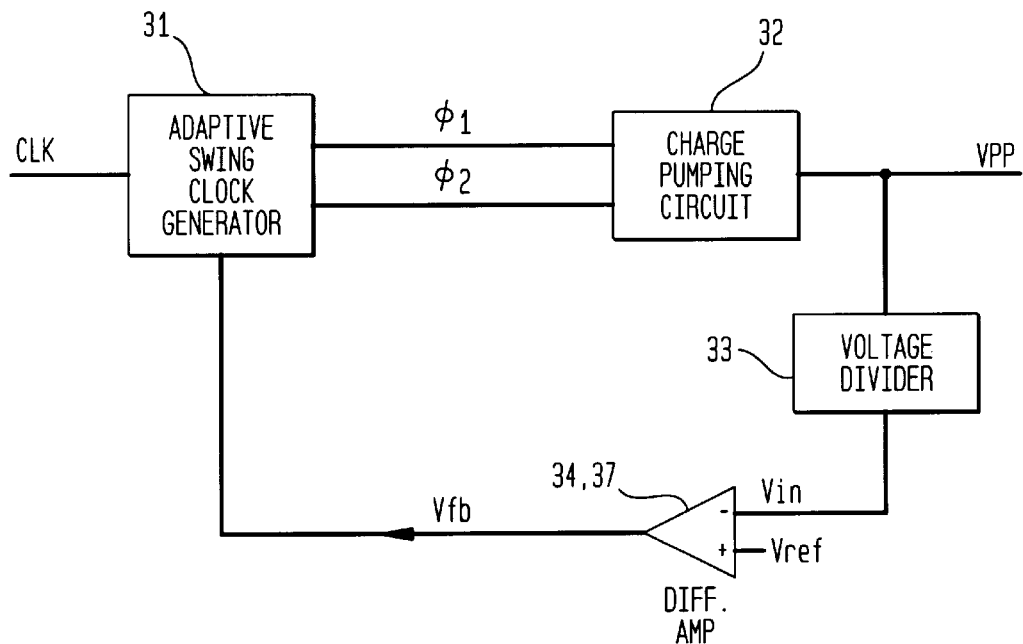
FIG. 9 shows the unified circuit structure of the present invention.
Figure 10:
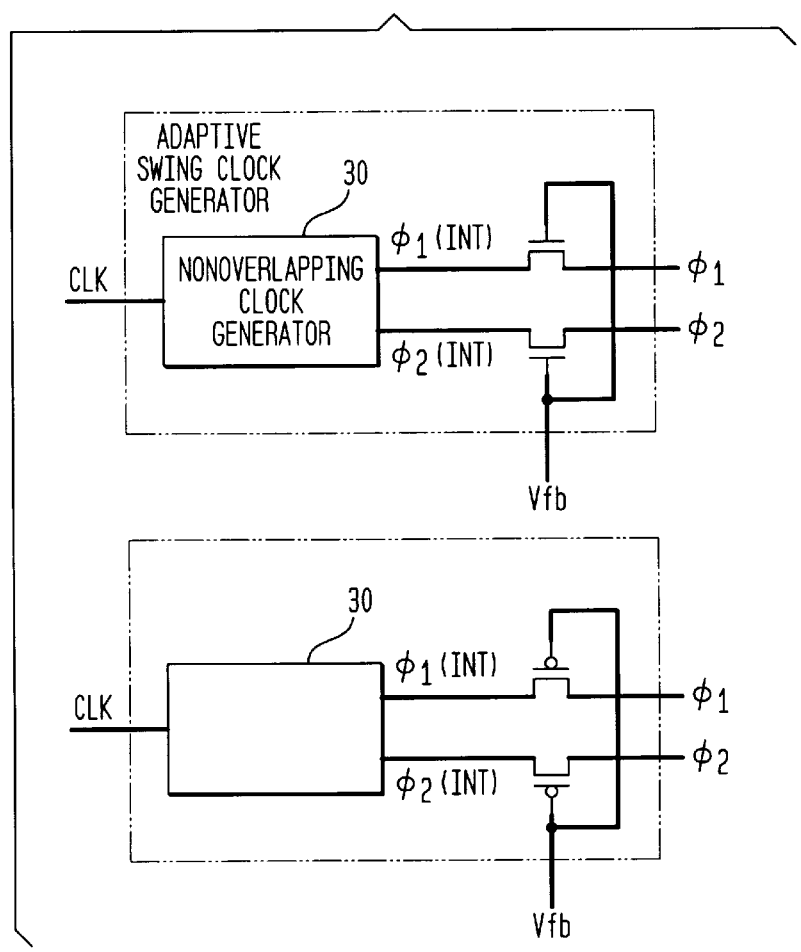
FIG. 10 shows alternate embodiments of a voltage regulation circuit with adaptive swing clock scheme in accordance with the present invention.
Figure 11:
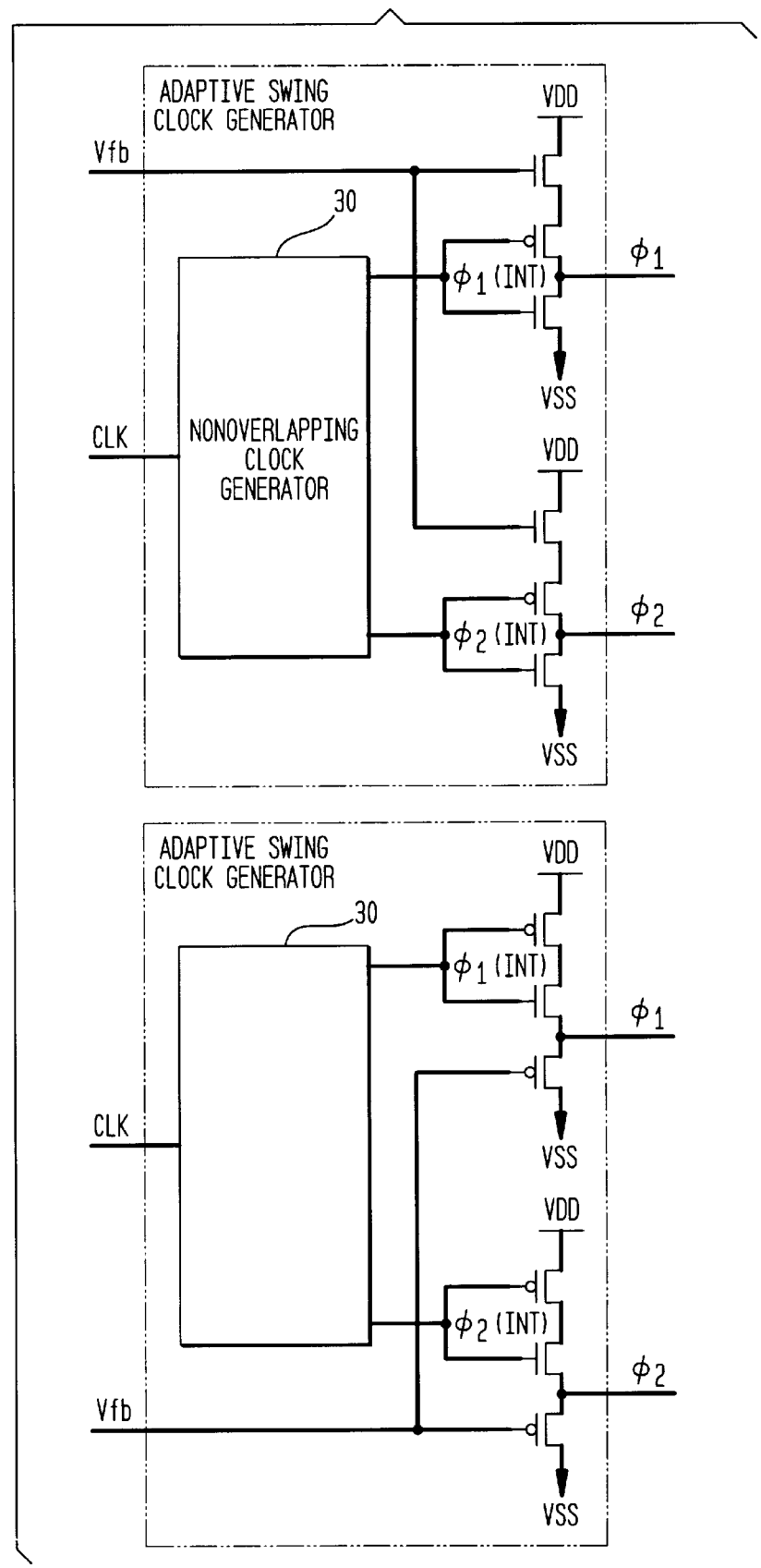
FIG. 11 shows further alternate embodiments of a voltage regulation circuit with adaptive swing clock scheme in accordance with the present invention.

A unified circuit structure for FIGS. 5 through 8 is shown in FIG. 9. The focus of this invention is the control of the swing amplitude of clock signals ø1 and ø2, which are applied to the charge pumping circuit 32 by the adaptive swing clock generator 31. In FIGS. 5–8, two traditional nonoverlapping clock generator circuits are shown (30 and 30'). However, other types of nonoverlapping clock generator circuits may also be used with corresponding modifications to the adaptive swing clock generator circuitry. Examples of these types of alternate embodiments are shown in FIGS. 10 and 11.

In these circuits, conventional nonoverlapping clock generators 30 output "internal clocks" ø1 (int) and ø2 (int), which use VDD as their real operating voltage. These internal clocks are then inputted to their respective pass transistor driver circuits, which provide regulated clock outputs ø1 and ø2 to an external charge pumping circuit. Negative feedback voltage Vfb is derived from the same type of voltage divider/differential amplifier circuit as described for FIGS. 5–9.

Figure 12:
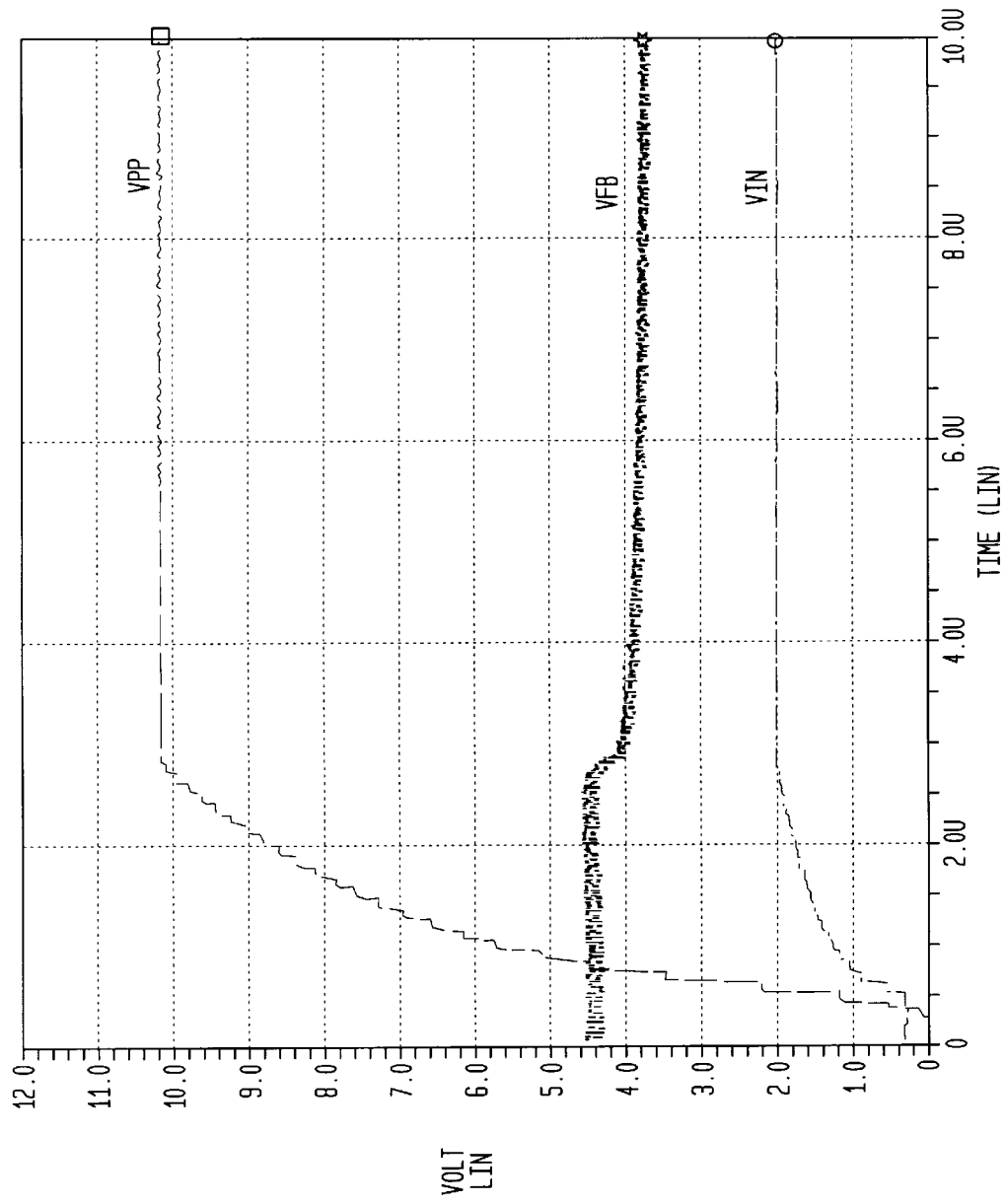
FIG. 12 shows simulation test results based on the circuit of FIG. 5.

FIG. 12 shows simulation test results for the circuit in FIG. 5. A capacitive voltage divider with an approximate division ratio of 1:5 was used. In this case, the capacitive voltage divider is made up of two normal NMOS devices acting as capacitors, and the pass transistor (MNR 35 in FIG. 5) is an intrinsic NMOS device. Furthermore, a reference voltage (Vref) of 2V was used. As can be seen from the simulation test results, feedback voltage Vfb has a large swing initially. However, once Vin reaches the 2V level (equal to Vref), the entire loop achieves a steady-state condition, and the Vfb swing is well controlled by the differential amplifier (34). As a result, output voltage VPP is maintained at a constant voltage level of about 10V.

In short, a voltage regulation circuit is disclosed with an adaptive clock swing capability. This novel approach provides the following three advantages:

(1) Voltage regulation is achieved by varying the clock swing amplitudes (fine control).
(2) No DC power is dissipated in either the capacitive voltage divider or the adaptive swing clock generator circuits.
(3) A precise, stable value of VPP is maintained, as determined by the capacitive division ratio.

The above described embodiments of the invention are intended to be illustrative only. Numerous alternative embodiments may be devised by those skilled in the art without departing from the spirit and scope of the following claims.

What is claimed is:

1. A method for regulating a voltage output signal for CMOS integrated circuits, comprising the steps of:
   a) generating clock output signals from a clock generator circuit, said clock generator circuit comprising a nonoverlapping clock generator in series with a pass transistor, wherein the voltage drop across said pass transistor is controlled by a feedback voltage from a comparator;
   b) receiving said clock output signals into a charge pumping circuit, and generating therefrom said voltage output signal, wherein said voltage output signal amplitude is proportional to the amplitude of said clock output signals;
   c) dividing down a portion of said voltage output signal;
   d) inputting said divided portion of said voltage output signal to a first input of said comparator;
   e) concurrently inputting a reference signal into a second input of said comparator;
   f) outputting a difference signal from said comparator;
   g) inputting said difference signal to said clock generator circuit; and
   h) biasing said clock generator circuit with said difference signal, such that said amplitude of said clock output signals varies inversely with changes in said voltage output signal,
   wherein said difference signal provides negative feedback to said clock generator circuit, such that said clock output signals control said charge pumping circuit to maintain said voltage output signal in a regulated condition.

2. A CMOS integrated circuit for regulating a voltage output signal, comprising:
   a clock generator circuit, connected between high and low power supply busses, for generating output clock signals with amplitudes that are derived from the voltage difference between said high and low power supply busses, wherein said clock generator circuit comprises a nonoverlapping clock generator in series with a pass transistor wherein the voltage drop across said pass transistor is controlled by a feedback voltage from a comparator;

a charge pumping circuit, receiving said output clock signals at an input, and generating therefrom said voltage output signal at an output, wherein said voltage output signal amplitude is proportional to the amplitude of said received output clock signals;

a voltage divider, connected to said voltage output signal, for outputting a divided portion of said voltage output signal;

wherein said comparator, having a first input for receiving said divided portion of said voltage output signal, and having a second input for receiving a reference voltage, wherein said comparator outputs said feedback voltage to said clock generator circuit, so as to vary the amplitude of said output clock signals in an inverse relationship with the amplitude changes of said voltage output signal.

3. The voltage regulating circuit of claim 2 wherein said pass transistor is an NMOS transistor connected between said nonoverlapping clock generator and said high power supply bus.

4. The voltage regulating circuit of claim 3 wherein said amplitude of said output clock signals is determined by the voltage difference between said high power supply bus less the voltage drop across said NMOS transistor, and said low power supply bus.

5. The voltage regulating circuit of claim 3 wherein said NMOS pass transistor is an intrinsic NMOS.

6. The voltage regulating circuit of claim 2 wherein said pass transistor is a PMOS transistor connected between said nonoverlapping clock generator and said low power supply bus.

7. The voltage regulating circuit of claim 6 wherein said amplitude of said output clock signals is determined by the voltage difference between said high power supply bus, and said low power supply bus plus the voltage drop across said PMOS transistor.

8. The voltage regulating circuit of claim 2 wherein said clock generator circuit comprises a nonoverlapping clock generator with first and second clock outputs, wherein each of said clock outputs is routed through an associated series pass device, said series pass devices being commonly controlled by said feedback voltage from said comparator.

9. The voltage regulating circuit of claim 8 wherein said series pass devices are NMOS transistors.

10. The voltage regulating circuit of claim 8 wherein said series pass devices are PMOS transistors.

11. The voltage regulating circuit of claim 8 wherein said series pass devices are combinations of NMOS and PMOS transistors.

12. The voltage regulating circuit of claim 2 wherein said voltage divider is a capacitive voltage divider.

13. The voltage regulating circuit of claim 2 wherein said voltage divider is a resistive voltage divider.

14. The voltage regulating circuit of claim 2 wherein said comparator is a differential amplifier.

15. The voltage regulating circuit of claim 2 wherein a steady-state condition is reached when said divided portion of said voltage output signal is equal to said reference voltage.

16. The voltage regulating circuit of claim 15 wherein there is no dc leakage current in said clock generator circuit.

17. A CMOS integrated circuit for regulating a voltage output signal, comprising:

a clock generator circuit, connected between high and low power supply busses, for general output clock signals with amplitudes that are derived from the voltage difference between said high and low power supply busses, wherein there is no dc leakage current in said clock generator circuit;

a charge pumping circuit, receiving said output clock signals at an input, and generating therefrom said voltage output signal at an output, wherein said voltage output signal amplitude is proportional to the amplitude of said received output clock signals;

a voltage divider, connected to said voltage output signal, for outputting a divided portion of said voltage output signal;

a comparator, having a first input for receiving said divided portion of said voltage output signal, and having a second input for receiving a reference voltage, wherein a steady-state condition is reached when said divided portion of said voltage output signal is equal to said reference voltage, wherein said comparator outputs a feedback voltage to said clock generator circuit, so as to vary the amplitude of said output clock signals in an inverse relationship with the amplitude changes of said voltage output signal.

* * * * *